(12) United States Patent
Kim et al.

(10) Patent No.: US 9,590,192 B2
(45) Date of Patent: Mar. 7, 2017

(54) TRANSISTOR AND METHOD FOR MANUFACTURING THE SAME

(71) Applicant: Kyungpook National University Industry-Academic Cooperation Foundation, Daegu (KR)

(72) Inventors: Youngkyoo Kim, Daegu (KR); Jooyeok Seo, Gyeongsangnam-do (KR); Hwajeong Kim, Daegu (KR)

(73) Assignee: KYUNGPOOK NATIONAL UNIVERSITY INDUSTRY-ACADEMIC COOPERATION FOUNDATION, Daegu (KR)

( * ) Notice: Subject to any disclaimer, the term of this patent is extended or adjusted under 35 U.S.C. 154(b) by 0 days.

(21) Appl. No.: 14/678,806

(22) Filed: Apr. 3, 2015

(65) Prior Publication Data

US 2016/0056395 A1 Feb. 25, 2016

(30) Foreign Application Priority Data

Mar. 21, 2014 (KR) ........................ 10-2014-0033530

(51) Int. Cl.
*H01L 29/08* (2006.01)
*H01L 51/00* (2006.01)
(Continued)

(52) U.S. Cl.
CPC .......... *H01L 51/0076* (2013.01); *C09K 19/12* (2013.01); *H01L 51/052* (2013.01);
(Continued)

(58) Field of Classification Search
CPC ............. H01L 51/0076; H01L 51/0035; H01L 51/052; H01L 51/107; C09K 19/12
See application file for complete search history.

(56) References Cited

U.S. PATENT DOCUMENTS

| 7,855,379 B2 | 12/2010 | Hayashi et al. |
| 8,088,652 B2 | 1/2012 | Hayashi et al. |

(Continued)

FOREIGN PATENT DOCUMENTS

| JP | 2004-311182 | 11/2004 |
| JP | 4707966 | 6/2011 |

(Continued)

OTHER PUBLICATIONS

Seo, J., et al., Liquid Crystal-on-Organic Field-Effect Transistor Sensory Devices for Perceptive Sensing of Ultralow Intensity Gas Flow Touch, Scientific Reports, 3 (2452), Aug. 16, 2013, 30 pgs.

*Primary Examiner* — William F Kraig
*Assistant Examiner* — Khatib Rahman
(74) *Attorney, Agent, or Firm* — Procopio, Cory, Hargreaves & Savitch LLP

(57) ABSTRACT

The present invention relates to a transistor and a method for manufacturing the same. The transistor according to an embodiment of the present invention includes a substrate, a drain electrode formed on the substrate, a source electrode formed on the substrate and spaced apart from the drain electrode, a channel layer formed on the substrate and including a channel region electrically connecting the drain electrode and the source electrode to each other, a gate electrode formed on the substrate and spaced apart from the channel region, and a liquid crystal layer formed on the substrate to connect the channel layer and the gate electrode to each other.

17 Claims, 6 Drawing Sheets

(51) Int. Cl.
*H01L 51/05* (2006.01)
*C09K 19/12* (2006.01)
(52) U.S. Cl.
CPC ........ *H01L 51/055* (2013.01); *H01L 51/0516* (2013.01); *C09K 2019/122* (2013.01)

(56) References Cited

U.S. PATENT DOCUMENTS

| | | | |
|---|---|---|---|
| 2004/0191951 A1* | 9/2004 | Shim | H01L 51/0516 438/99 |
| 2008/0290339 A1* | 11/2008 | Nakatani | H01L 27/283 257/40 |
| 2008/0291350 A1 | 11/2008 | Hayashi et al. | |
| 2010/0039589 A1* | 2/2010 | Shibahara | G02F 1/134363 349/96 |
| 2010/0191474 A1 | 7/2010 | Haick | |
| 2011/0065269 A1 | 3/2011 | Hayashi et al. | |
| 2011/0227056 A1* | 9/2011 | Maeda | C07D 239/60 257/40 |

FOREIGN PATENT DOCUMENTS

| | | |
|---|---|---|
| JP | 5196870 | 5/2013 |
| KR | 10-2004-0081171 | 9/2004 |
| KR | 10-2008-0098438 | 7/2008 |
| KR | 10-2011-0132814 | 12/2011 |
| KR | 10-2013-0025544 | 3/2013 |

\* cited by examiner

TRANSISTOR AND METHOD FOR MANUFACTURING THE SAME

CROSS-REFERENCE TO RELATED APPLICATIONS

This U.S. non-provisional patent application claims priority under 35 U.S.C. §119 to Korean Patent Application No. 10-2014-0033530, filed on Mar. 21, 2014, in the Korean Intellectual Property Office, the entire contents of which are hereby incorporated by reference.

STATEMENT REGARDING PRIOR DISCLOSURES BY THE INVENTORS

The inventors of the present application authored and disclosed the subject matter of the present application on Aug. 16, 2013 in a journal publication, announced in a press release on Aug. 19, 2013, disclosed online on Aug. 20, 2013, Aug. 27, 2013 Aug. 30, 2013, and Feb. 14, 2015, disclosed online and in a broadcasting interview on Aug. 21, 2013, and disclosed at a conference on Oct. 24, 2013. These prior disclosures have been submitted in an Information Disclosure Statement in the present application as "SEO, J., et al., Liquid Crystal-on-Organic Field-Effect Transistor Sensory Devices for Perceptive Sensing of Ultralow Intensity Gas Flow Touch, Scientific Reports, 3 (2452), Aug. 16, 2013, 30 pgs."

BACKGROUND

Technical Field

The present invention relates to a transistor and a method for manufacturing the same.

Background Art

An organic field effect transistor provides an advantage of being able to manufacture a plastic logic and a flexible display backplane with low costs. The maximum mobility of the organic field effect transistor has been improved using materials such as rubrene and pentacene derivatives. However, the maximum mobility of the organic field effect transistor still does not reach the maximum mobility of an inorganic field effect transistor. A hole mobility of the organic field effect transistor is affected by a gate insulating material as well as an organic semiconductor layer. This is because the mobility is sensitively affected by the amount of charges generated in an organic semiconducting channel layer by an electric field between a gate electrode and a source electrode. Various materials have been used as a gate insulator of the organic field effect transistor. A representative material of the gate insulator is silicon oxide ($SiO_x$). Since the silicon oxide is formed on a doped silicon wafer and has a low dielectric constant, it has been mainly used in the inorganic field effect transistor. However, since a thermal treatment performed at a temperature higher than 150° C. is needed to form the silicon oxide ($SiO_x$) gate insulator into a dense layer without a defect, it is difficult to apply the silicon oxide gate insulator to the organic field effect transistor.

SUMMARY OF INVENTION

Technical Problem

An object of the present invention is to provide a transistor having a new gate insulating material and a method for manufacturing the same.

Another object of the present invention is to provide a transistor capable of reducing a process cost and a method for manufacturing the same.

Still another object of the present invention is to provide an organic field effect transistor having a high hole mobility and a method for manufacturing the same.

The objects of the present invention are not limited to those described above. Other objects, which are not described above, of the present invention will be clearly understood from the following disclosure by those skilled in the art.

Solution to Problem

A transistor according to one aspect of the present invention includes: a substrate; a drain electrode formed on the substrate; a source electrode formed on the substrate and spaced apart from the drain electrode; a channel layer formed on the substrate, the channel layer including a channel region electrically connecting the drain electrode and the source electrode to each other; a gate electrode formed on the substrate and spaced apart from the channel region; and a liquid crystal layer formed on the substrate to connect the channel layer and the gate electrode to each other.

In an embodiment of the present invention, the liquid crystal layer is in contact with both a top surface of the channel layer disposed on the channel region and the gate electrode.

In an embodiment of the present invention, the gate electrode is formed in a region opposite to the channel region with respect to the drain electrode or the source electrode.

In an embodiment of the present invention, the liquid crystal layer includes liquid crystal molecules of which molecular orientations are changed according to a voltage of the gate electrode.

In an embodiment of the present invention, the liquid crystal layer includes nematic liquid crystal molecules.

In an embodiment of the present invention, the liquid crystal layer includes 4-cyano-4'pentylbiphenyl.

In an embodiment of the present invention, the channel layer includes an organic semiconductor layer.

In an embodiment of the present invention, the liquid crystal layer has a function as a gate insulating layer insulating the channel region and the gate electrode from each other.

In an embodiment of the present invention, the transistor further includes: a protective wall formed on the channel layer and the gate electrode to surround the channel region and at least a portion of the gate electrode. The liquid crystal layer is formed inside the protective wall.

In an embodiment of the present invention, the transistor further includes: a protective layer covering an opened top of the protective wall.

In an embodiment of the present invention, each of the protective wall and the protective layer includes a polymer film.

In an embodiment of the present invention, the protective wall and the protective layer include poly(ethylene terephthalate).

According to another aspect of the present invention, a transistor includes: a drain electrode; a source electrode spaced apart from the drain electrode; a channel layer including a channel region electrically connecting the drain electrode and the source electrode to each other; a gate electrode spaced apart from the channel region; and a liquid crystal layer formed on the channel layer, the liquid crystal layer extending from the channel region onto the gate electrode.

In an embodiment of the present invention, the liquid crystal layer has a function as a gate insulating layer insulating the channel region and the gate electrode from each other.

According to still another aspect of the present invention, a method for manufacturing a transistor includes: forming a drain electrode and a source electrode on a substrate; forming a gate electrode on the substrate, the gate electrode spaced apart from a region between the drain electrode and the source electrode; forming a channel layer on the substrate, the channel layer including a channel region electrically connecting the drain electrode and the source electrode to each other; and forming a liquid crystal layer on the substrate, the liquid crystal layer connecting the channel layer and the gate electrode to each other.

In an embodiment of the present invention, forming the liquid crystal layer includes: forming the liquid crystal layer being in contact with both a top surface of the channel layer disposed on the channel region and the gate electrode.

In an embodiment of the present invention, the method further includes: forming a protective wall surrounding the channel region and at least a portion of the gate electrode on the channel region and the gate electrode. Forming the liquid crystal layer includes: forming the liquid crystal layer inside the protective wall.

In an embodiment of the present invention, the method further includes: forming a protective layer covering an opened top of the protective wall after forming the liquid crystal layer inside the protective wall.

Advantageous Effect of Invention

Embodiments of the present invention provide the transistor having the new gate insulating material and the method for manufacturing the same.

In addition, embodiments of the present invention provide the transistor manufactured with a low process cost and the method for manufacturing the same.

Furthermore, embodiments of the present invention provide the organic field effect transistor having a high hole mobility and the method for manufacturing the same.

Effects of the present invention are not limited to the above effects. Other effects, which are not described, of the present invention will be clearly understood from the following disclosure by those skilled in the art.

DESCRIPTION OF EMBODIMENTS

Figure 1:
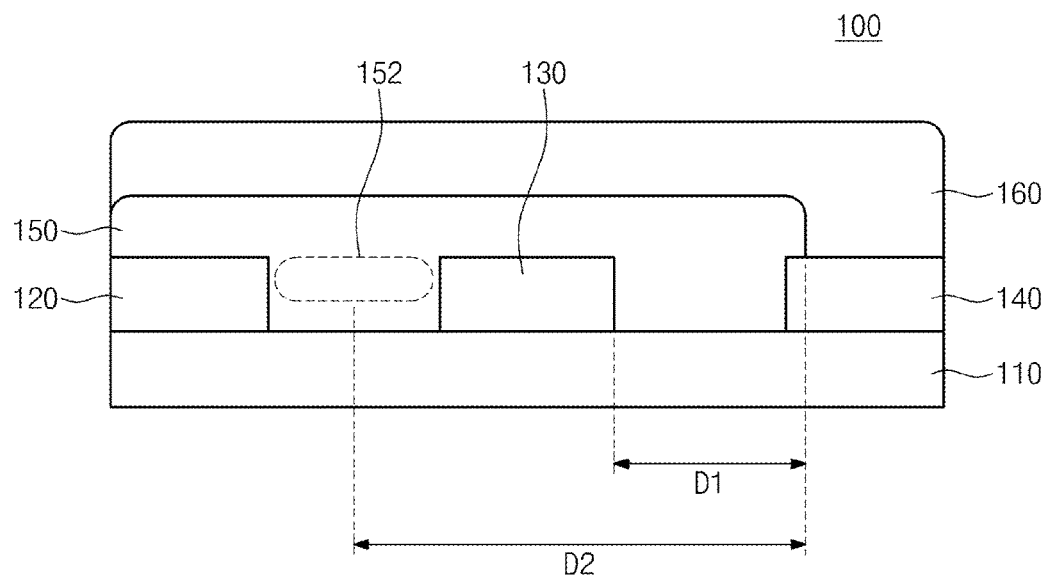
FIG. 1 is a cross-sectional view of a transistor according to an embodiment of the present invention.

The advantages and features of the present invention and methods of achieving them will be apparent from the following exemplary embodiments that will be described in more detail with reference to the accompanying drawings. It should be noted, however, that the present invention is not limited to the following exemplary embodiments. The scope of the present invention is to be determined by the broadest permissible interpretation of the following claims and their equivalents, and shall not be restricted or limited by the foregoing description. Unless otherwise defined, all terms (including technical and scientific terms) used herein have the same meaning as commonly understood by one of ordinary skill in the art to which example embodiments of the present invention belong. General descriptions to known elements may be omitted in order that features of the present invention. In the accompanying drawings, the same reference numerals or the same reference designators denote the same elements throughout the specification if possible. It will be understood that when an element such as a layer, region or substrate is referred to as being formed "on" another element, it can be directly on the other element or one or more intervening elements may be present.

A transistor according to an embodiment of the present invention includes a substrate, a drain electrode formed on the substrate, a source electrode formed to be spaced apart from the drain electrode on the substrate, a channel layer formed on the substrate and including a channel region electrically connecting the drain electrode and the source electrode to each other, a gate electrode formed to be spaced apart from the channel region on the substrate, and a liquid crystal layer formed to connect the channel layer to the gate electrode on the substrate. The liquid crystal layer has a function as a gate insulating layer insulating the channel region and the gate electrode from each other. Example embodiments of the present invention provide a transistor that has a high hole mobility and is able to be manufactured with a low process cost.

Figure 2:
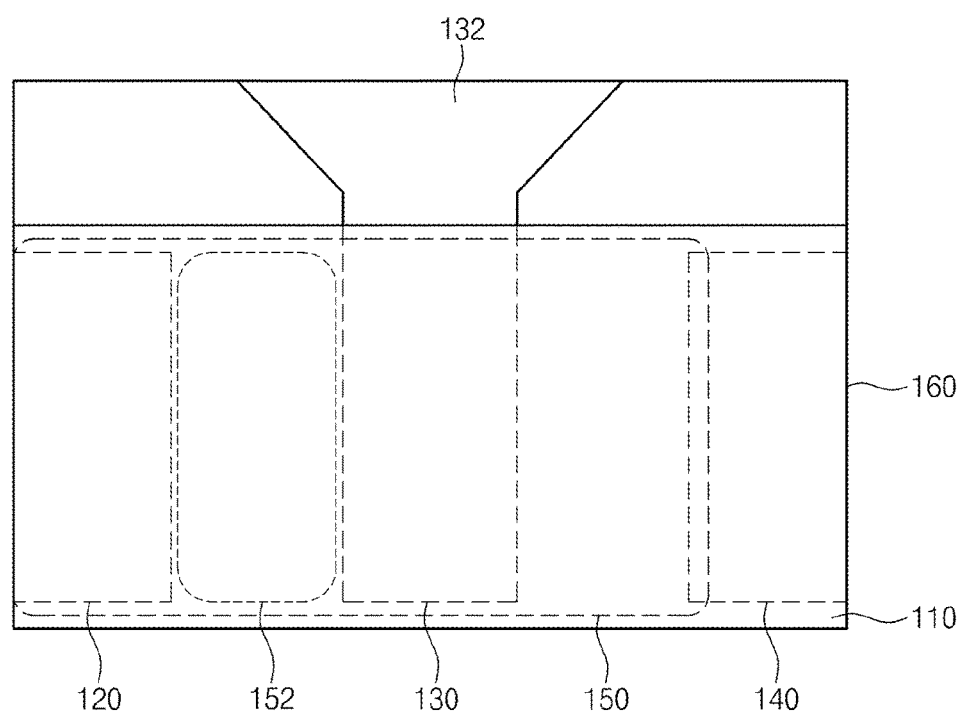
FIG. 2 is a plan view of a transistor according to an embodiment of the present invention.

FIG. 1 is a cross-sectional view of a transistor according to an embodiment of the present invention, and FIG. 2 is a plan view of a transistor according to an embodiment of the present invention. Referring to FIGS. 1 and 2, a transistor 100 according to an embodiment of the present invention includes a substrate 110, a drain electrode 120, a source electrode 130, a gate electrode 140, a channel layer 150, and a liquid crystal layer 160. The substrate 110 may be a silicon substrate, a glass substrate, or a plastic substrate. The plastic substrate may be formed of, for example, a polymer compound such as polyimide, polyethylenenaphthalate, or polyethylene terephthalate.

The drain electrode 120 and the source electrode 130 may be formed to be spaced apart from each other on the substrate 110. The drain electrode 120 and the source electrode 130 may include a conductive material. The source electrode 130 has a protrusion electrode structure 132 that extends outside the channel layer 150 to receive a source voltage. The drain electrode 120 and the source electrode 130 may include a metal, a metal compound, or a conductive organic polymer. For example, the drain electrode 120 and the source electrode 130 may be formed of a conductive material (e.g., gold (Au), silver (Ag), zinc (Zn), copper (Cu), aluminum (Al), nickel (Ni), indium-tin oxide (ITO), carbon nano tube, a polymer, a paste, an ink, or a transparent electrode (e.g., tungsten sulfide).

The gate electrode 140 may be formed on the substrate 110. The gate electrode 140 may be formed to be spaced apart from a region between the drain electrode 120 and the source electrode 130. In other words, the gate electrode 140 may be formed to be spaced apart from a channel region 152 of the channel layer 150 which is formed between the drain electrode 120 and the source electrode 130. The gate electrode 140 may be formed in a region opposite to the channel region 152 with respect to the drain electrode 120 or the source electrode 130. The gate electrode 140 may be formed of a conductive material. An electrode having a work function of 4.7 eV to 5.3 eV may be used as the gate electrode 140. For example, the gate electrode 140 may be formed of the conductive material such as silver (Ag), nickel (Ni), or gold (Au).

The channel layer 150 may be formed on the substrate 110. The channel layer 150 may be formed to electrically connect the drain electrode 120 and the source electrode 130 to each other. In other words, the channel layer 150 includes the channel region 152 which electrically connects the drain electrode 120 and the source electrode 130 to each other. The channel layer 150 may be formed to be in direct contact with the drain electrode 120 and the source electrode 130 or may be indirectly connected to the drain electrode 120 and the source electrode 130 by using one or more additional materials having conductivity as a medium. The channel layer 150 may be provided to cover the drain electrode 120 and the source electrode 130. The channel layer 150 may include an organic semiconductor layer, an inorganic semiconductor layer, or an organic and inorganic mixture semiconductor layer. The organic semiconductor layer may include a polymer active layer. The channel layer 150 may be formed of the organic semiconductor layer which is bendable and has flexibility, so a flexible transistor may be realized.

For example, the organic semiconductor layer may be formed of at least one of poly(3-hexylthiophene) (P3HT), pentacene, tetracene, anthracene, naphthalene, rubrene, coronene, perylene, phthalocyanine, derivatives thereof, a conjugated polymer derivative including thiophene, poly(9, 9-dioctylfluoreneco-bithiophene) (F8T2), poly(3,3-didodecylquarter-thiophene) (PQT-12), poly (2,5-bis(3-tetradecyl-thiophen-2-yl)thieno(3,2-b)thiophene (PBTTT), or a conjugated polymer derivative including fluorine.

The liquid crystal layer 160 may be formed on the substrate 110 and the channel layer 150. The liquid crystal layer 160 may be formed to extend from the channel region 152 onto the gate electrode 140. The liquid crystal layer 160 may be formed to connect the channel layer 150 to the gate electrode 140. In an embodiment of the present invention, the liquid crystal layer 160 has a function as a gate insulating layer insulating the channel region 152 and the gate electrode 140 from each other. In an embodiment of the present invention, the liquid crystal layer 160 may be in contact with both a top surface of the channel layer 150 disposed on the channel region 152 and the gate electrode 140. The liquid crystal layer 160 may include liquid crystal molecules of which molecular orientations are changed according to a voltage of the gate electrode 140. The liquid crystal layer 160 may include, for example, nematic liquid crystal molecules. The liquid crystal layer 160 may include, for example, 4-cyano-4'pentylbiphenyl (5CB) liquid crystal molecules.

Figure 3:
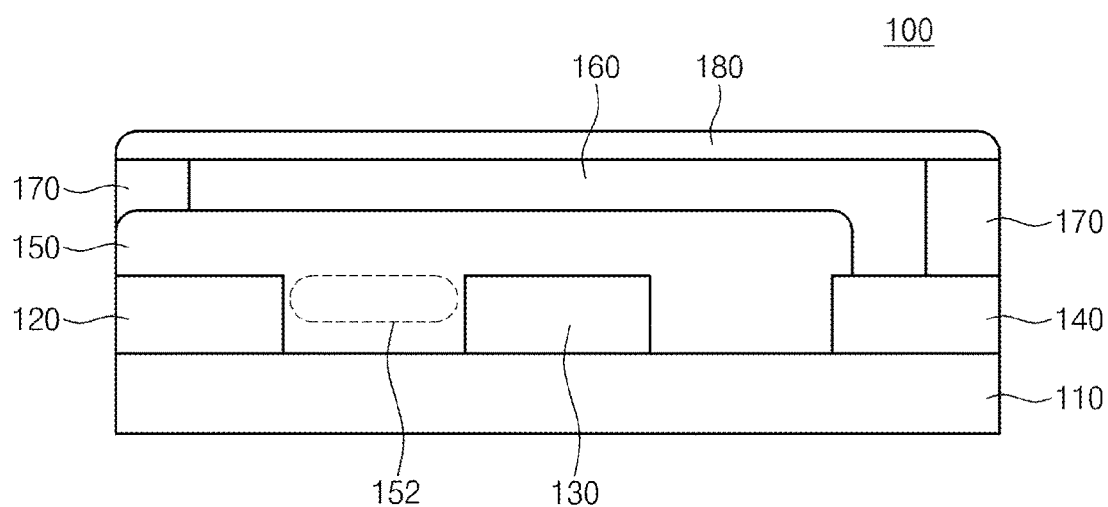
FIG. 3 is a cross-sectional view of a transistor according to another embodiment of the present invention.

FIG. 3 is a cross-sectional view of a transistor according to another embodiment of the present invention. In the embodiment of FIG. 3, descriptions to the same elements as or corresponding elements of the embodiment of FIGS. 1 and 2 may be omitted to avoid duplication of explanation. A transistor 100 according to the embodiment of FIG. 3 further includes a protective wall 170 and a protective layer 180. The protective wall 170 may be formed on the channel layer 150 and the gate electrode 140 to surround the channel region 152 and at least a portion of the gate electrode 140. The protective wall 170 may have, for example, a quadrilateral shape so as to be formed along a circumference of a region including the channel region 152 and the gate electrode 140. The liquid crystal layer 160 may be formed inside the protective wall 170. The protective layer 180 may cover an opened top of the protective wall 170.

If the liquid crystal layer 160 similar to a liquid is directly exposed in air, the liquid crystal layer 160 may be weak in external physical contact and destruction of the liquid crystal layer 160 may be caused. Thus, after the liquid crystal layer 160 is formed inside the protective wall 170, the liquid crystal layer 160 is covered with the protective layer 180 such as a thin protective film skin. As a result, the liquid crystal layer 160 is protected. In an embodiment of the prevent invention, each of the protective wall 170 and the protective layer 180 may include a polymer film. The protective wall 170 and the protective layer 180 may include poly(ethylene terephthalate) (PET).

Figure 4A:
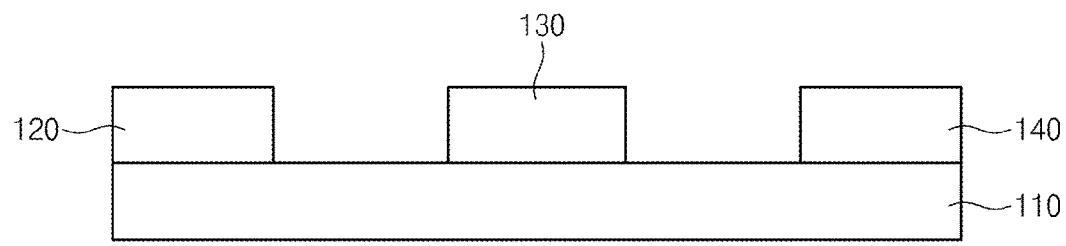
FIGS. 4a to 4e are views illustrating a method for manufacturing the transistor according to the embodiment shown in FIG. 3.

FIGS. 4a to 4e are views illustrating a method for manufacturing the transistor according to the embodiment shown in FIG. 3. Referring to FIGS. 3 and 4a, the drain electrode 120, the source electrode 130, and the gate electrode 140 are formed on the substrate 110. The drain electrode 120, the source electrode 130, and the gate electrode 140 may be formed by a method of forming a conductive layer (not shown) on the substrate 110, by a method of patterning the conductive layer (not shown) after the formation of the conductive layer (not shown), or by a method of forming a conductive layer after covering the substrate 110 with a patterned mask.

The drain electrode 120, the source electrode 130, and the gate electrode 140 may be formed by, for example, a thermal evaporation process, an E-beam evaporation process, a sputtering process, a micro contact printing process, or a nano imprinting process. For example, the drain electrode 120, the source electrode 130, and the gate electrode 140 may include a conductive material (e.g., gold (Au), silver (Ag), zinc (Zn), copper (Cu), aluminum (Al), chrome (Cr), molybdenum (Mo), titanium (Ti), tantalum (Ta), nickel (Ni), indium-tin oxide (ITO), carbon nano tube, or a polymer), a paste, or an ink.

The gate electrode 140 may be formed to be spaced apart from a region between the drain electrode 120 and the source electrode 130. In other words, the gate electrode 140 may be formed to be spaced apart from a channel region 152 of the channel region 150 which is formed between the drain electrode 120 and the source electrode 130. The gate electrode 140 may be formed in a region opposite to the channel region 152 with respect to the drain electrode 120 or the source electrode 130.

Figure 4B:
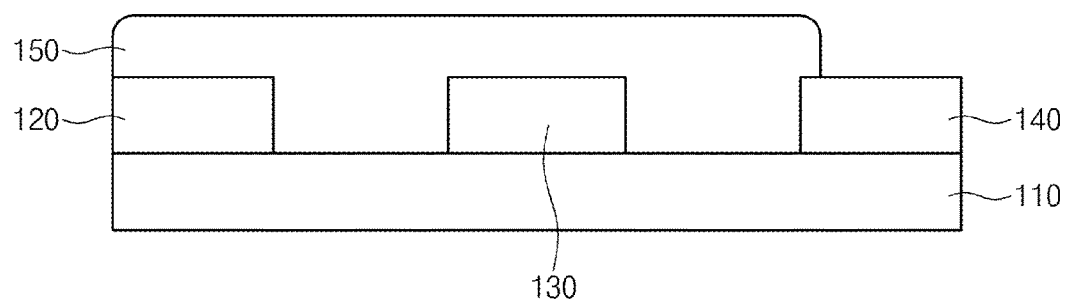

Referring to FIGS. 3 and 4b, the channel layer 150 is formed on the substrate 110. The channel layer 150 may be formed to cover the drain electrode 120, the source electrode 130, and a portion of the gate electrode 140. The channel region 152 is formed between the drain electrode 120 and the source electrode 130. The channel region 152 electrically connects the drain electrode 120 and the source electrode 130 to each other. The channel layer 150 may be formed through a spin coating process, an inkjet printing process, or a vacuum deposition process. The channel layer 150 may include an organic semiconductor layer, an inorganic semiconductor layer, or an organic and inorganic mixture semiconductor layer. The organic semiconductor layer may include a polymer active layer.

Figure 4C:
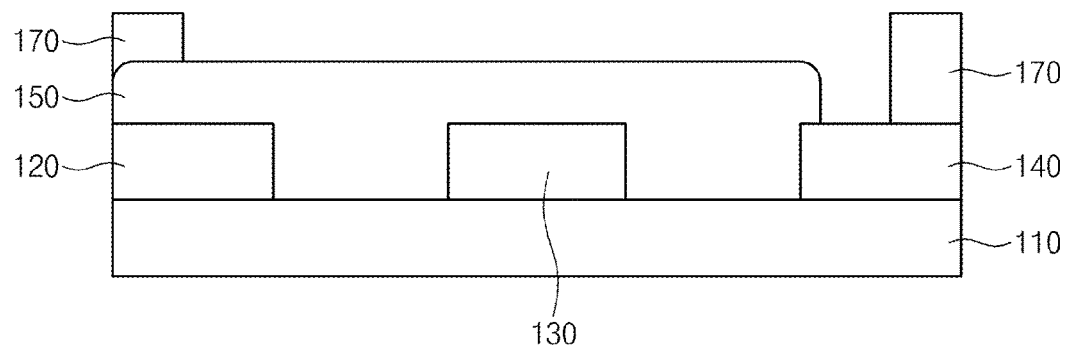
Figure 4D:
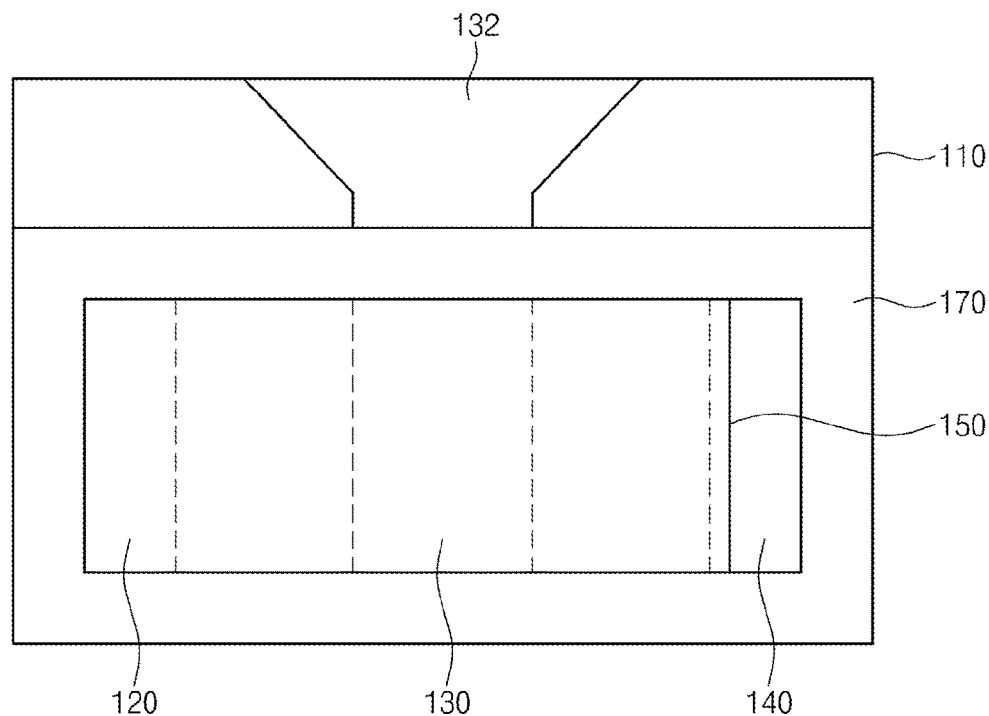

FIG. 4d is a plan view of FIG. 4c. Referring to FIGS. 3, 4c, and 4d, the protective wall 170 is formed on the substrate 110. The protective wall 170 may be formed on the channel layer 150 and the gate electrode 140 to surround the channel region 152 and at least a portion of the gate electrode 140. The protective wall 170 may have, for example, a quadrilateral shape so as to be formed along a circumference of a region including the channel region 152 and the gate electrode 140. The protective wall 170 may include a polymer material such as poly(ethylene terephthalate) (PET).

Figure 4E:
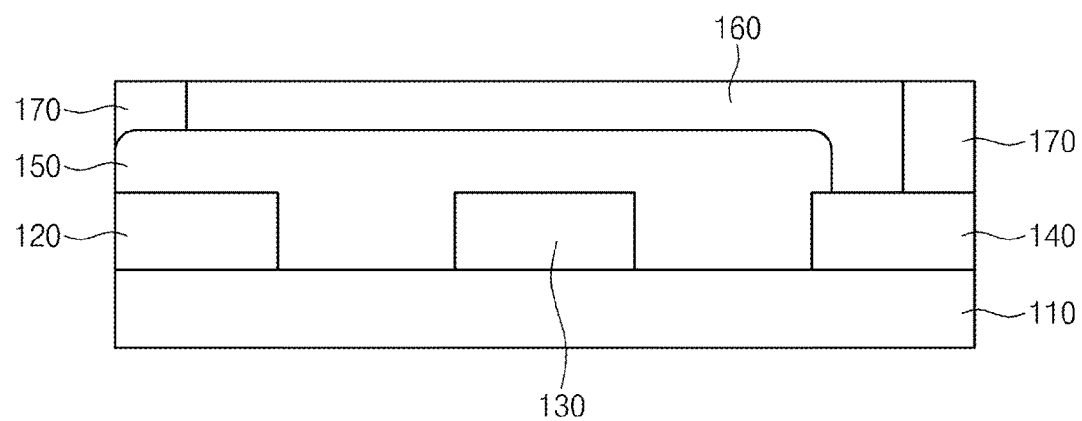

Referring to FIGS. 3 and 4e, liquid crystal molecules are applied onto the channel layer 150 and the gate electrode 140 to form the liquid crystal layer 160. The liquid crystal layer 160 may be formed inside the protective wall 170. The liquid crystal layer 160 may be formed to extend from the channel region 152 onto the gate electrode 140. In other words, the liquid crystal layer 160 may be formed to connect the channel layer 150 and the gate electrode 140 to each other. In an embodiment of the present invention, the liquid crystal layer 160 may be in contact with both a top surface of the channel layer 150 disposed on the channel region 152 and the gate electrode 140. The liquid crystal layer 160 may include, for example, nematic liquid crystal molecules.

Referring to FIG. 3, after the liquid crystal layer 160 fills the inside of the protective wall 170, the protective layer 180 is formed to cover an opened top of the protective wall 170. Thus, the transistor 100 according to an embodiment of the present invention is manufactured. The protective layer 180 may include a film which is formed of a polymer material such as poly(ethylene terephthalate) (PET). The transistor 100 according to the embodiment shown in FIG. 3 has characteristics of a p-type transistor. Even though the transistor 100 according to an embodiment of the present invention has a high threshold voltage by a relatively long distance between the channel region 152 and the gate electrode 140, the transistor 100 has a high on/off ratio and a high hole mobility.

Figure 5:
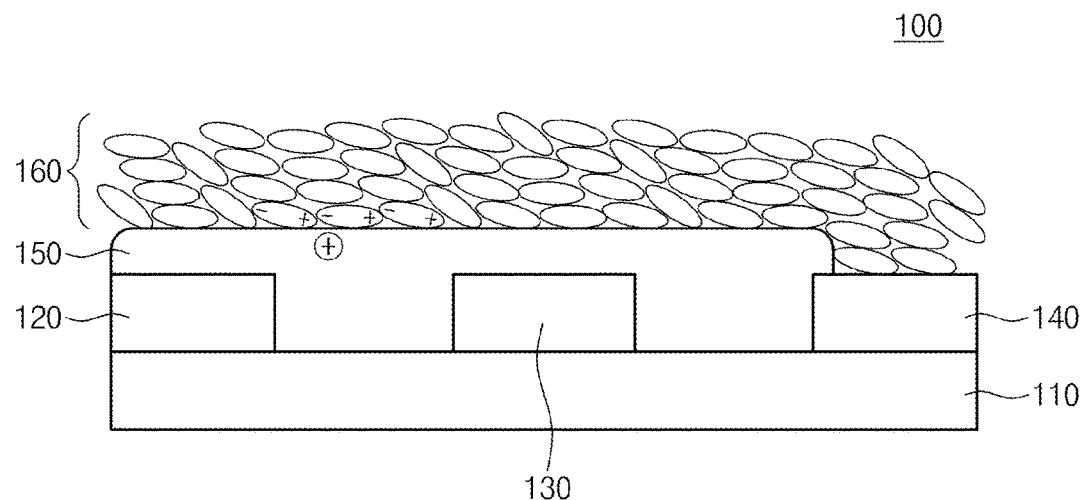
FIGS. 5 and 6 are views illustrating an operating mechanism of a transistor according to an embodiment of the present invention.
Figure 6:
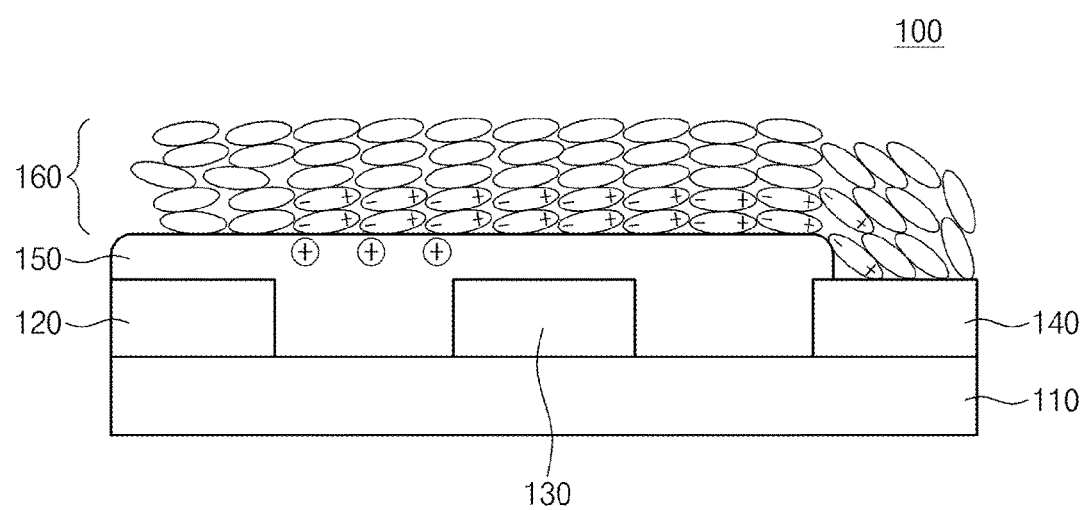

FIGS. 5 and 6 are views illustrating an operating mechanism of a transistor according to an embodiment of the present invention. If the liquid crystal layer 160 is formed on the channel layer 150 when a gate voltage is 0 V, the molecules of the liquid crystal layer 160 are randomly but partially oriented due to a surface characteristic of the channel layer 150, as shown in FIG. 5. If a low gate voltage (e.g., −60 V) is applied, most of liquid crystal molecules around the channel region between the drain electrode 120 and the source electrode 130 are nearly completely aligned in a drain-source direction, as shown in FIG. 6. In other words, the liquid crystal molecules around the channel region of the channel layer 150 are indirectly aligned by an electric field formed by the gate electrode 140, and thus, charges are induced in the channel region of the channel layer 150. In other words, the liquid crystal layer 160 may have the function as the gate insulating layer, the orientations of the liquid crystal molecules of the liquid crystal layer 160 are aligned according to the voltage of the gate electrode 140, and an induced charged density of the channel region 152 is changed by a strong dipole effect. Thus, the voltage applied to the gate electrode 140 may be adjusted to control turn-on/turn-off operations of the transistor 100.

Embodiment 1

After drain electrode, a source electrode, and a gate electrode were formed on a substrate by patterning a glass substrate coated with indium-tin oxide, the substrate was cleaned. A channel length between the source electrode and the drain electrode was 15 μm. A distance between the source electrode and the drain electrode was also 15 μm. A width of the source electrode was 18 μm.

After poly(3-hexylthiophene) (P3HT) powder was dissolved in toluene until a solid concentration was in a range of 15 mg/ml to 30 mg/ml, a P3HT film was spin-coated on the cleaned glass substrate. Next, a thermal treatment was performed at 120° C. for a half hour to form a channel layer. The P3HT film had a weight-average molecular weight of 30 kDa, a polydispersity index of 1.7, and a regioregularity of 97%. A thickness of the P3HT film was 25 nm.

A protective wall that had a quadrilateral hole at its center and was formed of poly(ethylene terephthalate) (PET) was formed on the P3HT film. A thickness of the protective wall was 100 μm. 4-cyano-4'pentylbiphenyl (5CB; Sigma-Aldrich) was applied to the inside of the quadrilateral hole of the protective wall, thereby forming a liquid crystal layer having a thickness of 100 μm on the channel layer and the gate electrode. A PET film was formed on the protective wall filled with the liquid crystal layer to manufacture a liquid crystal gated organic field effect transistor (LC-g-OFET). Characteristics of the liquid crystal gated organic field effect transistor were measured using a measurement system including a semiconductor analyzer (Keithley 4200 SCS).

Figure 7:
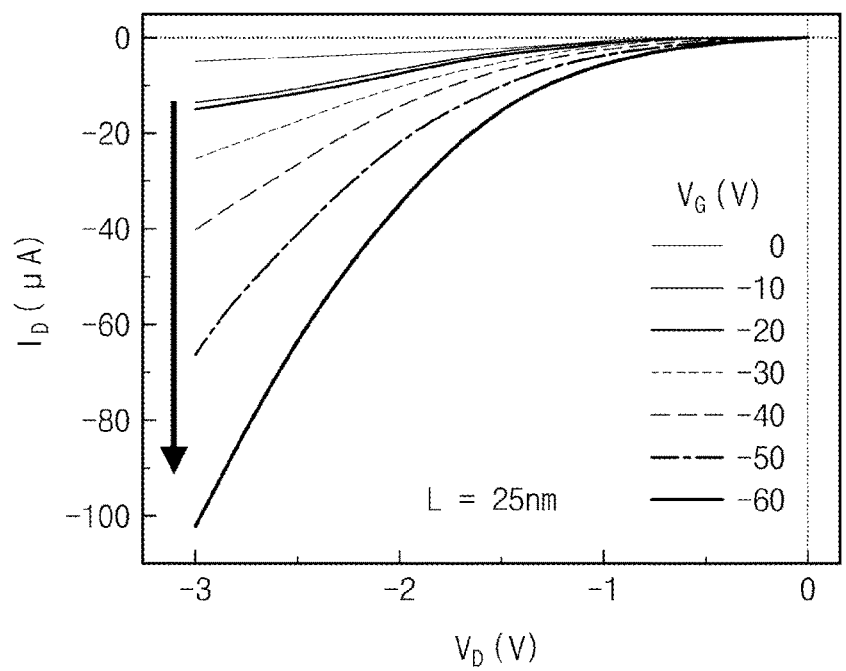
FIG. 7 is a graph showing a variation of a drain current according to a drain voltage of a transistor according to an embodiment of the present invention when a gate voltage is changed.
Figure 8:
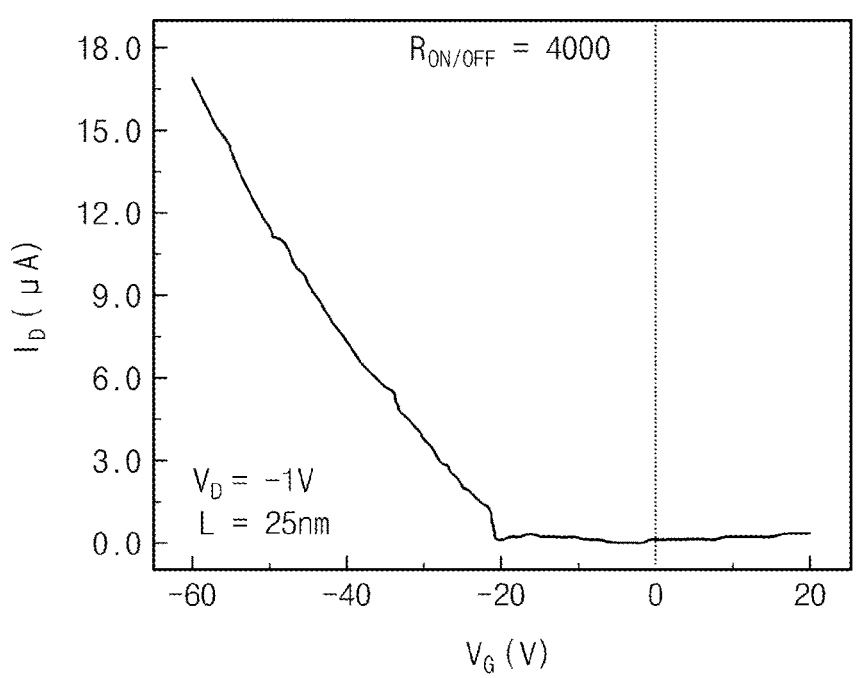
FIG. 8 is a graph showing a variation of a drain current according to a gate voltage of a transistor according to an embodiment of the present invention.

FIG. 7 is a graph showing a variation of a drain current according to a drain voltage of a transistor according to an embodiment of the present invention when a gate voltage is changed. FIG. 8 is a graph showing a variation of a drain current according to a gate voltage of a transistor according to an embodiment of the present invention. In FIG. 7, a gate voltage $V_G$ was changed from 0 V to −60V at intervals of 10 V. From the graph of FIG. 7, it can be confirmed that the transistor according to the embodiment of the present invention has transistor characteristics. A drain current $I_D$ rapidly increases as a drain voltage $V_D$ increases. The drain current $I_D$ increases as a magnitude of the gate voltage $V_G$ increases. Referring to FIG. 8, when the drain voltage $V_D$ is −1 V, the drain current $I_D$ rapidly increases as the gate voltage $V_G$ decreases from −20 V. In addition, an on/off ratio $R_{ON/OFF}$ has a high value of 4000.

The transistor according to the embodiment of the present invention is used as itself and may also be applied to a device capable of responding to physical or chemical ultra-microstimulation. Thus, the transistor according to the embodiment of the present invention may be applied to various touch sensors. The transistor according to the embodiment of the present invention may have a simple structure, all processes of manufacturing the transistor may be easily performed at a room temperature, and the transistor may be manufactured using a plastic film substrate. Thus, the transistor may be manufactured with a low cost. The transistor according to the embodiment of the present invention may use the flexible plastic film and transparent electrode, so it may be used to realize a flexible transparent liquid crystal-display.

While the present invention has been described with reference to example embodiments, it will be apparent to those skilled in the art that various changes and modifications may be made without departing from the spirit and scope of the present invention. Therefore, it should be understood that the above embodiments are not limiting, but illustrative. Thus, the scope of the present invention is to be determined by the broadest permissible interpretation of the following claims and their equivalents, and shall not be restricted or limited by the foregoing description.

EXPLANATION OF THE SIGNS OF THE DRAWINGS

100: Transistor
110: Substrate
120: Drain electrode
130: Source electrode
140: Gate electrode
150: Channel layer
160: Liquid crystal layer
170: Protective wall
180: Protective layer

The invention claimed is:

1. A transistor comprising:
a substrate;
a drain electrode on the substrate;
a source electrode on the substrate, the source electrode being spaced apart from the drain electrode;
a channel layer on the substrate, the channel layer comprising a channel region electrically connecting the drain electrode and the source electrode to each other;
a gate electrode on the substrate, the gate electrode being spaced apart from the channel region; and
a liquid crystal layer on the substrate, the liquid crystal layer comprising liquid crystal molecules of which molecular orientations are changed according to a voltage of the gate electrode and connecting the channel layer and the gate electrode to each other, wherein the gate electrode is disposed in a region opposite to the channel region with respect to the drain electrode or the source electrode.

2. The transistor of claim 1, wherein the liquid crystal layer is in contact with both a top surface of the channel region and the gate electrode.

3. A transistor, comprising:
a substrate;
a drain electrode on the substrate;
a source electrode on the substrate, the source electrode being spaced apart from the drain electrode;
a channel layer on the substrate, the channel layer comprising a channel region electrically connecting the drain electrode and the source electrode to each other;
a gate electrode on the substrate, the gate electrode being spaced apart from the channel region; and
a gate insulating layer on the substrate, the gate insulating layer connecting the channel layer and the gate electrode to each other,
wherein the gate electrode is disposed in a region opposite to the channel region with respect to the drain electrode or the source electrode.

4. The transistor of claim 1, wherein the liquid crystal layer comprises nematic liquid crystal molecules.

5. The transistor of claim 1, wherein the liquid crystal layer comprises 4-cyano-4'pentylbiphenyl.

6. The transistor of claim 1, wherein the channel layer comprises an organic semiconductor layer.

7. The transistor of claim 1, wherein the liquid crystal layer has a function as a gate insulating layer insulating the channel region and the gate electrode from each other.

8. The transistor of claim 1, further comprising:
a protective wall on the channel layer and the gate electrode to surround the channel region and at least a portion of the gate electrode,
wherein the liquid crystal layer is formed inside the protective wall.

9. The transistor of claim 8, further comprising:
a protective layer covering an opened top portion of the protective wall.

10. The transistor of claim 9, wherein each of the protective wall and the protective layer comprises a polymer film.

11. The transistor of claim 9, wherein each of the protective wall and the protective layer comprises poly(ethylene terephthalate).

12. A transistor comprising:
a drain electrode;
a source electrode spaced apart from the drain electrode;
a channel layer comprising a channel region electrically connecting the drain electrode and the source electrode to each other;
a gate electrode spaced apart from the channel region; and
a liquid crystal layer on the channel layer, the liquid crystal layer comprising liquid crystal molecules of which molecular orientations are changed according to a voltage of the gate electrode and extending from the channel region onto the gate electrode, wherein the gate electrode is disposed in a region opposite to the channel region with respect to the drain electrode or the source electrode.

13. The transistor of claim 12, wherein the liquid crystal layer has a function as a gate insulating layer insulating the channel region and the gate electrode from each other.

14. A method for manufacturing a transistor, the method comprising:
forming a drain electrode and a source electrode on a substrate;
forming a gate electrode on the substrate, the gate electrode spaced apart from a region between the drain electrode and the source electrode;
forming a channel layer on the substrate, the channel layer comprising a channel region electrically connecting the drain electrode and the source electrode to each other; and
forming a liquid crystal layer on the substrate, the liquid crystal layer comprising liquid crystal molecules of which molecular orientations are changed according to a voltage of the gate electrode and connecting the channel layer and the gate electrode to each other, wherein the gate electrode is disposed in a region opposite to the channel region with respect to the drain electrode or the source electrode.

15. The method of claim 14, wherein forming the liquid crystal layer comprises: forming the liquid crystal layer being in contact with both a top surface of the channel region and the gate electrode.

16. The method of claim 14, further comprising:
forming a protective wall surrounding the channel region and at least a portion of the gate electrode on the channel layer and the gate electrode,
wherein forming the liquid crystal layer comprises: forming the liquid crystal layer inside the protective wall.

17. The method of claim 16, further comprising:
forming a protective layer covering an opened top portion of the protective wall after forming the liquid crystal layer inside the protective wall.

* * * * *